United States Patent
Sandhu

Patent Number: 5,926,718
Date of Patent: Jul. 20, 1999

[54] METHOD FOR FORMING A CAPACITOR

[75] Inventor: Gurtej Singh Sandhu, Boise, Id.

[73] Assignee: Micron Technology, Inc., Boise, Id.

[21] Appl. No.: 08/699,914

[22] Filed: Aug. 20, 1996

[51] Int. Cl.⁶ .................................................. H01L 21/20
[52] U.S. Cl. .......................... 438/396; 438/254; 438/397
[58] Field of Search .................................... 438/396, 397, 438/253, 254, 256, 399

[56] References Cited

U.S. PATENT DOCUMENTS

| | | | |
|---|---|---|---|
| 5,108,943 | 4/1992 | Sandhu et al. | 438/254 |
| 5,155,657 | 10/1992 | Oehrlein et al. | 438/397 |
| 5,187,549 | 2/1993 | Fujii | 257/306 |
| 5,225,697 | 7/1993 | Malhi et al. | 257/302 |
| 5,290,726 | 3/1994 | Kim | 437/52 |
| 5,327,375 | 7/1994 | Harari | 365/149 |
| 5,330,928 | 7/1994 | Tseng | 437/52 |
| 5,354,701 | 10/1994 | Chao | 437/52 |
| 5,409,856 | 4/1995 | Jun | 438/254 |
| 5,434,812 | 7/1995 | Tseng | 365/149 |
| 5,436,186 | 7/1995 | Hsue et al. | 437/52 |
| 5,677,222 | 10/1997 | Tseng | 438/254 |
| 5,714,401 | 2/1998 | Kim et al. | 438/397 |
| 5,789,267 | 8/1998 | Hsia et al. | 438/396 |

Primary Examiner—Tuan H. Nguyen
Attorney, Agent, or Firm—Schwegman, Lundberg, Woessner & Kluth P.A.

[57] ABSTRACT

A method for forming a capacitor (36) outwardly from a semiconductor substrate (10). Alternating layers of first and second materials (20 and 22) are formed outwardly from a semiconductor substrate. A first set of vias (24) is formed through the layers of first and second materials (20 and 22) to the semiconductor substrate(10). A second set of vias (26) is formed through the layers of first and second materials (20 and 22). Each via in the second set (26) is formed in a location that is adjacent to one of the vias of the first set (24). A trunk (28) of the first plate (34) of the capacitor (36) is formed by selectively depositing a semiconductor material, such as poly-silicon, to fill the first set of vias (24). A set of fins (30) and a dome (32) are formed on the trunk (28) to complete the first plate (34) by removing the alternating layers of first layers (20) and selectively depositing a semiconductor material between the second layers (22). The dome (32) comprises a layer of semiconductor material that is formed outwardly from the outermost layer of second material (22) with a surface area that is greater than the planar projection of the layer. The capacitor (34) is completed by removing the alternating layers of second material (22), conformally depositing a dielectric material (38) outwardly from the first plate, and forming a second plate (40) for the capacitor (34) outwardly from the dielectric layer (38).

19 Claims, 7 Drawing Sheets ary to practice the invention, and it is to be understood that
METHOD FOR FORMING A CAPACITOR

TECHNICAL FIELD OF THE INVENTION

The present invention relates generally to integrated circuits and, in particular, to a capacitor and method for forming a capacitor.

BACKGROUND OF THE INVENTION

Electronic systems, such as microprocessor based computers, typically operate on data that is stored in electronic form in a memory device. The memory device stores the data at specified voltage levels in an array of cells. The voltage levels represent that the data is either a logical "1" or a "0." In dynamic random access memory (DRAM) devices, for example, the cells store the data as a charge on a capacitor. When the data is read from the memory device, the device checks the charge on the capacitor using sense amplifiers that detect small differences in charge on these capacitors so as to produce a "1" or a "0" output based on the stored charge.

As the size of memory devices decreases, the capacitor in each cell occupies a smaller surface area of the semiconductor substrate. These smaller capacitors cannot store as much charge because the storage capacity of a typical capacitor is proportional to the size of its storage electrodes. Typically, the area of the storage electrode is approximately equal to the surface area of the substrate dedicated to the capacitor. Unfortunately, at some point, the size of the smaller capacitors interferes with the ability of the sense amplifiers to differentiate between charge on the capacitors due to noise and the charge due to data stored in the cell. This can lead to errors in the output of a memory device making the memory device useless in the electronic system.

Designers have experimented with various techniques for producing capacitors that can store more charge while using less surface area of the semiconductor substrate. In these devices, designers have used texturization, stacked V-shaped plates and other shaped plates to increase the size of the electrode without increasing the surface area of the substrate used for the capacitors. Unfortunately, there are drawbacks with these techniques. For example, the techniques add a number of mask steps to the traditional process flow thus increasing the complexity of the process and the chance for errors to creep into the final product.

For the reasons stated above, and for other reasons stated below which will become apparent to those skilled in the art upon reading and understanding the present specification, there is a need in the art for a capacitor for use in, for example, a memory device with increased storage capacity without adding mask steps that disrupt and complicate the traditional process flow.

SUMMARY OF THE INVENTION

The above mentioned problems with capacitors and other problems are addressed by the present invention and which will be understood by reading and studying the following specification. A capacitor is described which increases the storage capacity without adding mask steps to the traditional process flow by using selective poly-silicon deposition.

In particular, one embodiment of the present invention provides forming a first plate of a capacitor that comprises a trunk extending from a semiconductor substrate and a dome formed outwardly from the trunk that has a surface area that is greater than its planar projection. The capacitor is completed by forming a dielectric layer outwardly from the first plate and forming a top plate outwardly from the dielectric layer. The capacitor can be used, for example, to store data in a memory device. In one embodiment, the trunk and dome are formed by selective deposition of poly-silicon. In one embodiment, a plurality of fins that extend from the trunk are formed to increase the surface area of the capacitor.

In another embodiment, a method for forming a capacitor in a memory device outwardly from a semiconductor substrate is provided. Alternating layers of first and second materials are formed outwardly from a semiconductor substrate. In one embodiment, these layers comprise first and second dielectric materials that are selectively etchable. A set of vias is formed through the layers of first and second materials to the semiconductor substrate. A trunk of the first plate of the capacitor is formed by selectively depositing a semiconductor material, such as poly-silicon, to fill the first set of vias. A set of fins and a dome are formed on the trunk to complete the first plate by removing the alternating layers of first material and selectively depositing a semiconductor material in the space that was occupied by the alternating layers of first material. The dome comprises a layer of semiconductor material that is formed outwardly from the outermost layer of second material with a surface area that is greater than the planar projection of the layer. The capacitor is completed by removing the alternating layers of second material, and forming a dielectric layer and second plate for the capacitor outwardly from the first plate.

In one embodiment, the domes of adjacent first plates are formed at different distances from the semiconductor substrate such that adjacent domes form overlapping projections on a surface of the semiconductor substrate.

In one embodiment, the present invention provides a memory device. The memory device includes a plurality of storage cells that are addressed by row and column addressing circuits. The cells include an access transistor with a gate coupled to a word line and a first terminal coupled to a bit line. A capacitor is coupled to a second terminal of the access transistor. The capacitor includes a cell plate separated from a first plate by a dielectric layer. The first plate comprises a trunk extending outwardly from the second terminal, a plurality of branches or fins extending in layers from the trunk, and a dome layer having a surface area that is greater than its planar projection.

DETAILED DESCRIPTION OF THE INVENTION

In the following detailed description of the illustrative embodiments, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be used and that logical, mechanical and electrical changes may be made without departing from the spirit and scope of the present invention. The following detailed description is, therefore, not to be taken in a limiting sense.

FIGS. 1A through 1F are cross-sectional views of a semiconductor substrate 10 that illustrate process steps according to an embodiment of the present invention. The process produces a capacitor with storage plates that have increased surface area without introducing additional mask steps into a conventional process flow by using selective deposition of poly-silicon. Advantageously, the stacked capacitor formed by the process can be used, for example, in a memory cell of a dynamic random access memory (DRAM). Thus, the illustrative embodiment of FIGS. 1A through 1F are described in conjunction with a DRAM cell. However, the present invention is not limited to a capacitor for use with a DRAM. Rather, a capacitor constructed according to the present invention can be used in other appropriate electronic circuits.

Figure 1A:
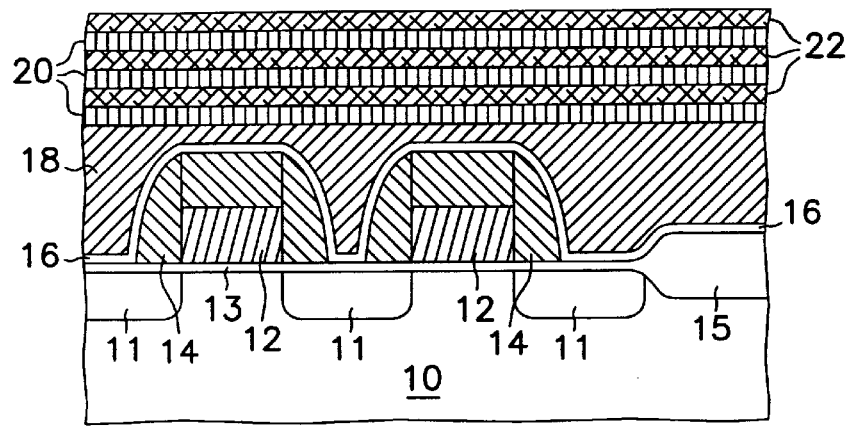
FIGS. 1A through 1F are cross-sectional views of a semiconductor substrate illustrating process steps according to an illustrative embodiment of the present invention.

As shown in FIG. 1A, doped regions or wells 11 are formed in semiconductor substrate 10 using conventional techniques known to a person of ordinary skill in the art. Similarly, word lines 12 and spacers 14 are formed outwardly from semiconductor substrate 10 using conventional techniques to define the gate of the access devices of two cells of a DRAM device. Word lines 12 are separated from semiconductor substrate 10 by gate oxide layer 13. Field oxide 15 is grown outwardly from semiconductor substrate 10 to separate selected access devices in the DRAM device. Etch stop layer 16 is formed outwardly from spacers 14 and semiconductor substrate 10. Etch stop layer 16 may comprise, for example, a ceramic etch stop layer. Advantageously, etch stop layer 16 saves a mask step as described below, however, etch stop layer 16 may be omitted from the process. Oxide layer 18 is formed outwardly from etch stop layer 16. Advantageously, oxide layer 18 may comprise, for example, a layer formed by the conformal chemical vapor deposition of tetraethoxysilane (TEOS). Oxide layer 18 can be planarized before further processing although this is unnecessary.

Alternating layers of first and second dielectric materials, 20 and 22, respectively, are formed outwardly from oxide layer 18. Advantageously, layers 20 and 22 are chosen to be selectively etchable by different chemicals or processes such that exposed portions of layers 20 or 22 can be removed without significantly affecting the exposed portions of the other layers. For example, layers 20 may comprise silicon dioxide and layers 22 may comprise $Si_3N_4$. Other dielectric materials that are selectively etchable can be used as alternatives to these materials.

Figure 1B:
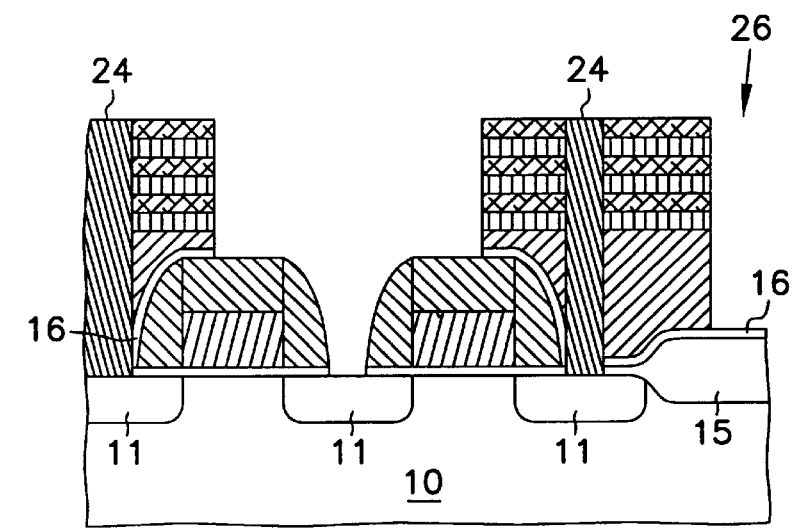

As shown in FIG. 1B, a set of vias 24 are etched through layers 20 and 22, and oxide layer 18 to a doped region 11 of semiconductor substrate 10. Poly-silicon is selectively deposited to fill vias 24 to form trunks 28 of a first plate of the capacitor. Advantageously, with selective deposition, poly-silicon deposits only where silicon is exposed. Thus, vias 24 are filled with poly-silicon. Further, a portion 26 of layers 20 and 22, oxide layer 18 and etch stop layer 16 is removed on opposite sides of each via 24.

Figure 1C:
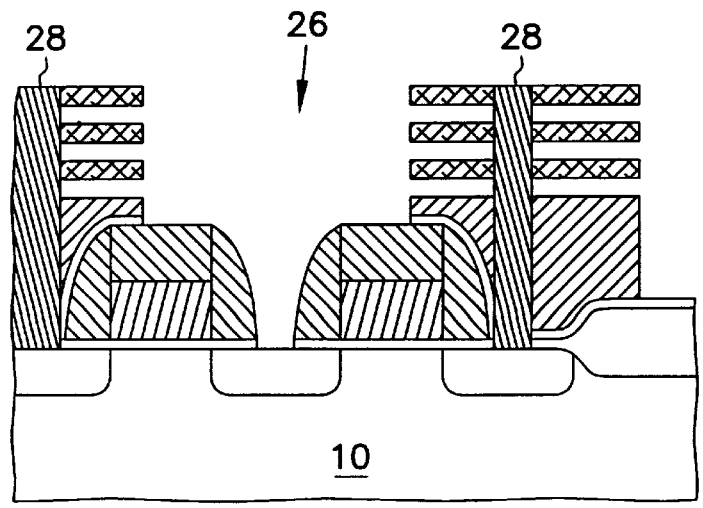
Figure 1D:
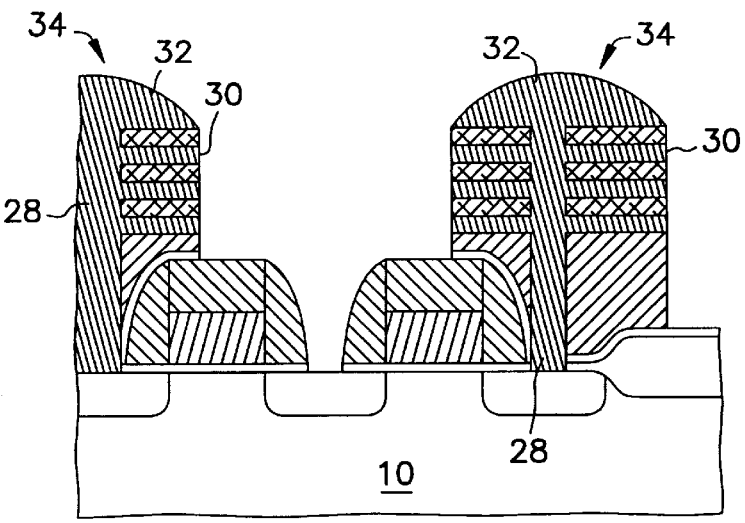
Figure 1E:
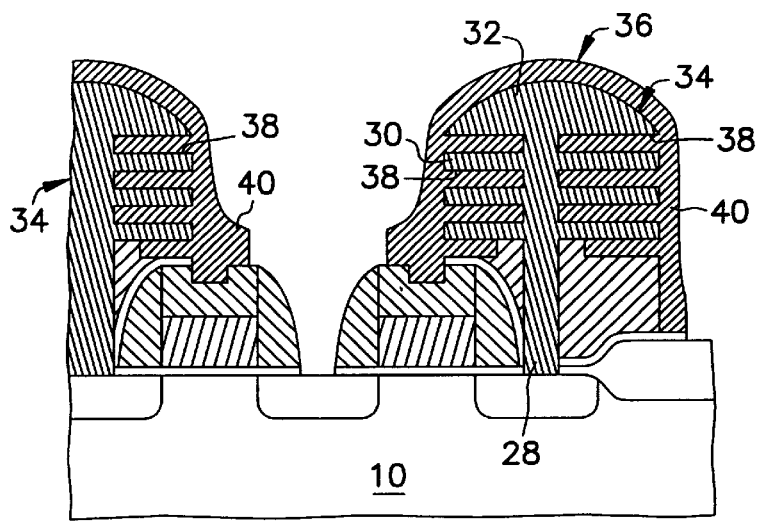
Figure 1F:
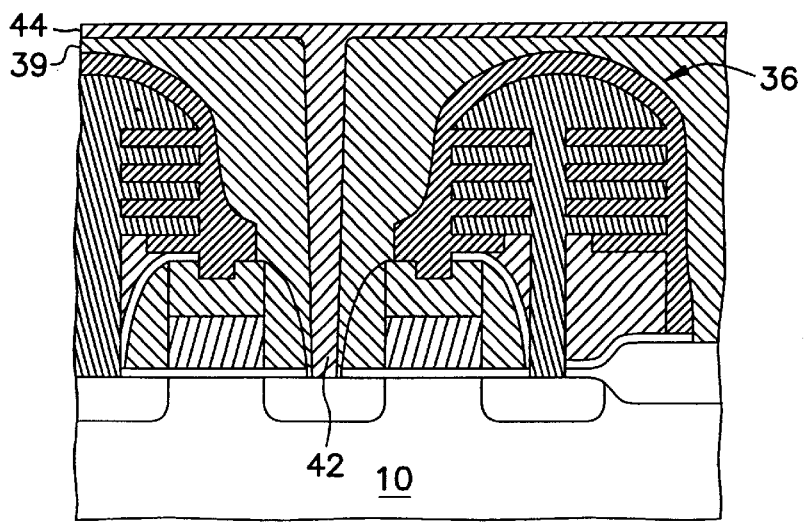

As shown in FIG. 1C, portions of layers 20 are removed with a wet etch. Alternatively, layers 22 could be removed at this point and layers 20 could remain in place. As shown in FIG. 1D, a second selective deposition step fills the space between layers 22 with fins 30 that extend from trunks 28. Further, the selective deposition step produces layer or dome 32 of, for example, poly-silicon outwardly from the outermost layer 22. Layer 32 has a surface area that exceeds its planar projection. Layers 22 are removed by, for example, an additional wet etch process. As shown in FIG. 1E, each set of trunk 28, fins 30 and dome 32 comprises first plate 34 of capacitor 36. Dielectric layer 38 is formed outwardly from exposed portions of first plates 34. Further, top electrode 40 is deposited and patterned outwardly from bottom electrodes 34. Finally, as shown in FIG. 1F, dielectric layer 39 is conformally deposited and planarized outwardly from top electrode 40. Bit contact 42 is formed so as to provide a connection to a shared doped region 11. Further bit line 44 is formed outwardly from dielectric layer 39 in contact with bit contact 42.

Figure 2:
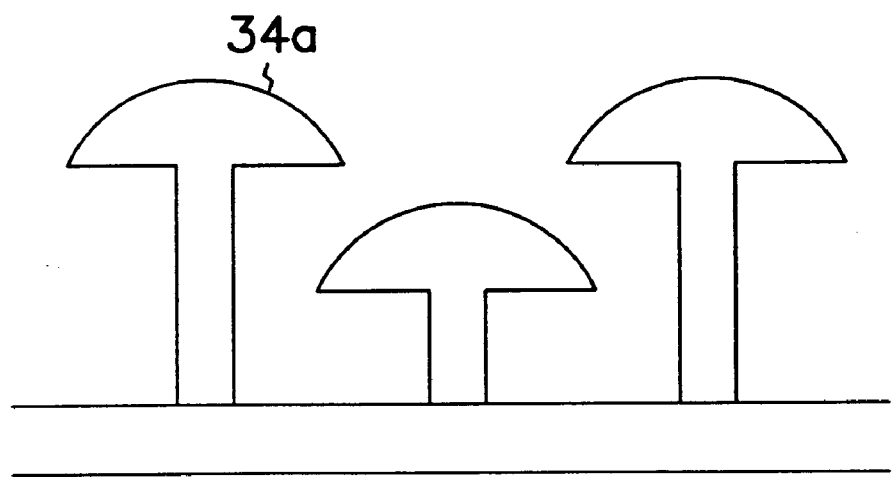
FIG. 2 is a cross-sectional view of another illustrative embodiment of the present invention.
Figure 3:
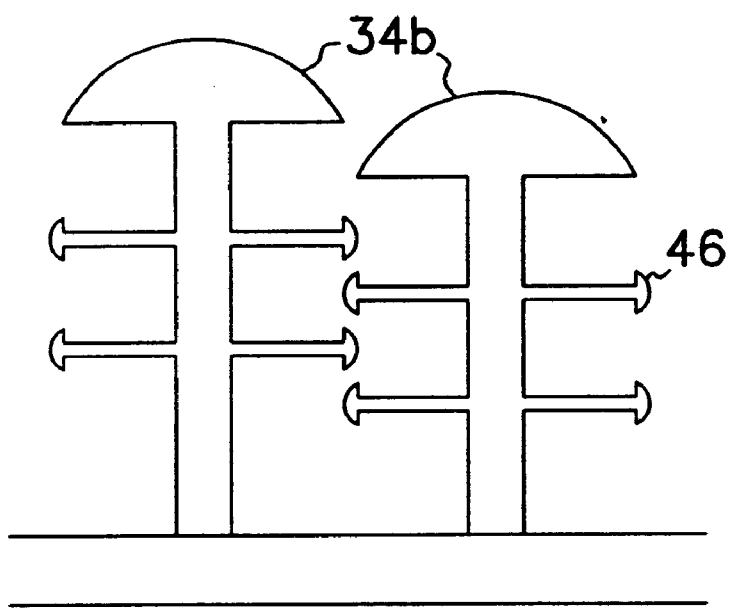
FIG. 3 is a cross-sectional view of another illustrative embodiment of the present invention.

FIGS. 2 and 3 illustrate alternative embodiments of first plates for capacitors. For example, the embodiment of FIG. 2 illustrates that the step of forming fins 30 may be omitted. In this embodiment, domes 32 are formed at different levels outwardly from semiconductor substrate 10 such that portions of adjacent first plates 34 form overlapping projections on a surface of semiconductor substrate 10. Further, by controlling the duration of the selective deposition of fins 30, outgrowths 46 can be added to increase the surface area of first plate 34b as shown in the embodiment of FIG. 3.

FIGS. 4A through 4F are cross-sectional views of a semiconductor substrate 110 that illustrate process steps according to another embodiment of the present invention. As with the embodiment of FIGS. 1A through 1F, this process also uses selective deposition of poly-silicon. Advantageously, the stacked capacitor formed by the process can be used, for example, in a memory cell of a DRAM or any other appropriate electronic circuit. The embodiment of FIGS. 4A through 4B does not show bit lines because the bit lines are not viewable in this cross section. However, a bit line does contact each access device as is known to one of ordinary skill in the art. This embodiment shows that one advantage of this process is the ability to reduce the spacing between capacitors, to more efficiently use the surface area of semiconductor substrate 110.

Figure 4A:
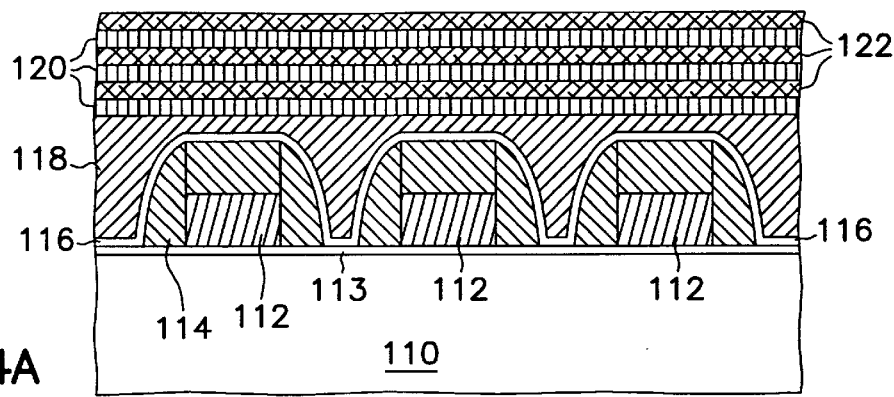
FIGS. 4A through 4F are cross-sectional views of a semiconductor substrate illustrating process steps according to another illustrative embodiment of the present invention.

As shown in FIG. 4A, word lines 112 and spacers 114 are formed outwardly from semiconductor substrate 110 using conventional techniques to define the gate of the access devices of three cells of a DRAM device. Word lines 112 are separated from semiconductor layer 110 by gate oxide layer 113. Etch stop layer 116 is formed outwardly from spacers 114 and semiconductor substrate 110. Etch stop layer 116 may comprise, for example, a ceramic etch stop layer. Advantageously, etch stop layer 116 saves a mask step as described below, however, etch stop layer 116 may be omitted from the process. Oxide layer 118 is formed outwardly from etch stop layer 116. Advantageously, oxide layer 118 may comprise, for example, a layer formed by the conformal chemical vapor deposition of tetraethoxysilane (TEOS) or other appropriate oxide. Oxide layer 118 can be planarized before further processing although this is unnecessary.

Alternating layers of first and second dielectric materials, 120 and 122, respectively, are formed outwardly from oxide layer 118. Advantageously, layers 120 and 122 are chosen to be selectively etchable by different chemicals or processes such that exposed portions of layers 120 or 122 can be removed without significantly affecting the exposed portions of the other layers. For example, layers 120 may comprise silicon dioxide and layers 122 may comprise $Si_3N_4$. Other dielectric materials that are selectively etchable can be used as alternatives to these materials.

Figure 4B:
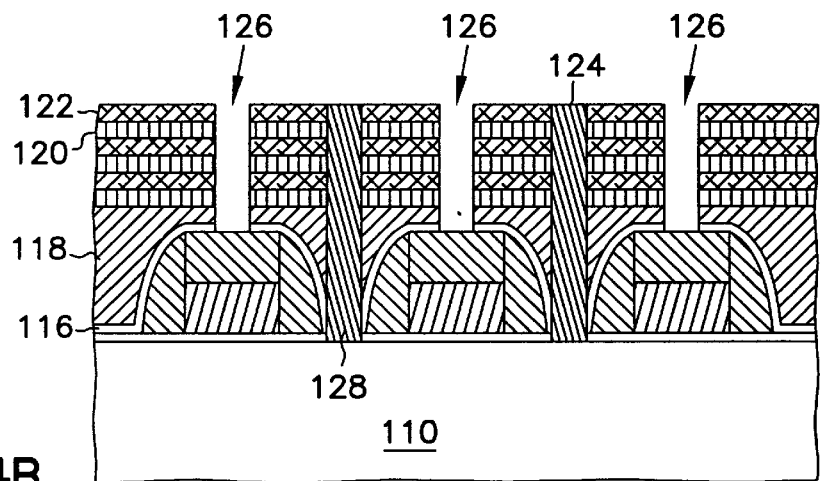

As shown in FIG. 4B, a set of vias 124 are etched through layers 120 and 122, and layer 118 to a surface of semiconductor substrate 110. Further, a second set of vias 126 are etched through layers 120 and 122, and layer 118 to etch stop layer 116 on opposite sides of each via 124. Poly-silicon is selectively deposited to fill vias 124 to form trunks 128 of a first plate of the capacitor. Advantageously, with selective deposition, poly-silicon deposits only where silicon is exposed. Thus, vias 124 are filled with poly-silicon and vias 126 are not filled. It is noted that by using etch stop layer 116, a single mask may be used to form both sets of vias 124 and 126. In this manner, the capacitor is formed with the same number of masks as in conventional processes.

Figure 4C:
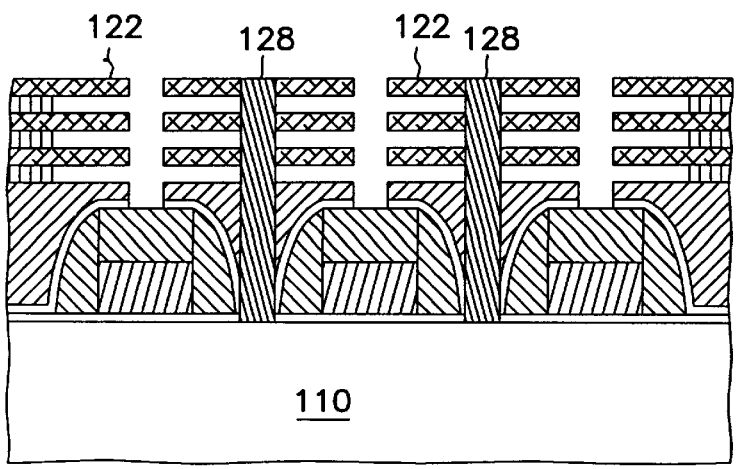
Figure 4D:
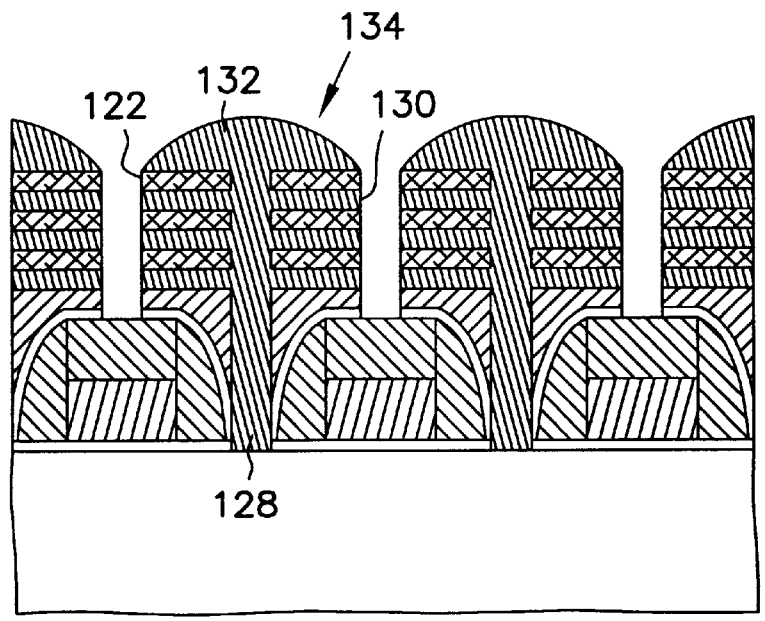

As shown in FIG. 4C, portions of layers 120 are removed with a wet etch. Alternatively, layers 122 could be removed at this point and layers 120 could remain in place. A second selective deposition step fills the space between layers 122 with fins 130 that extend from trunks 128 as shown in FIG. 4D. The deposition of fins 130 is controlled such that the spacing between adjacent fins 130 can be less than the critical dimension by timing the growth of fins 130 outwardly from trunk 128. Further, the selective deposition step produces layer or dome 132 of, for example, poly-silicon outwardly from the outermost layer 122. Layer 132 has a surface area that exceeds its planar projection.

Figure 4E:
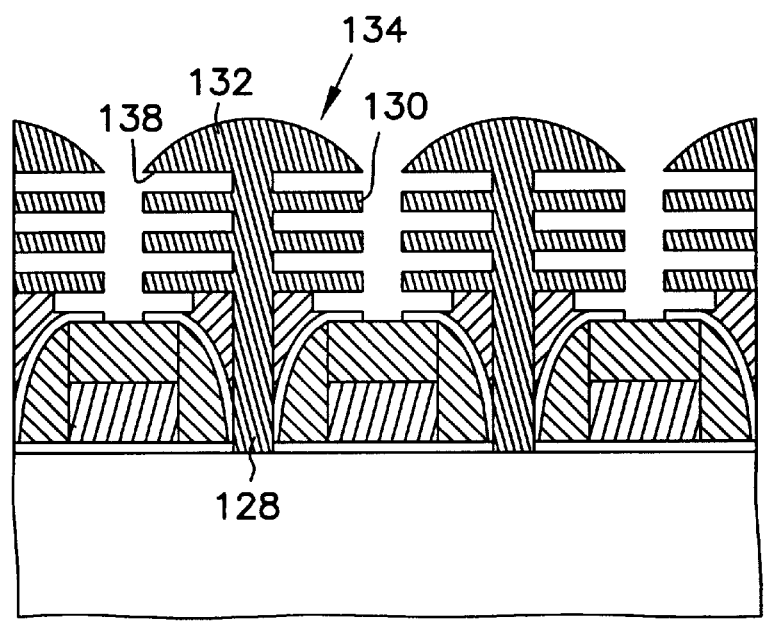
Figure 4F:
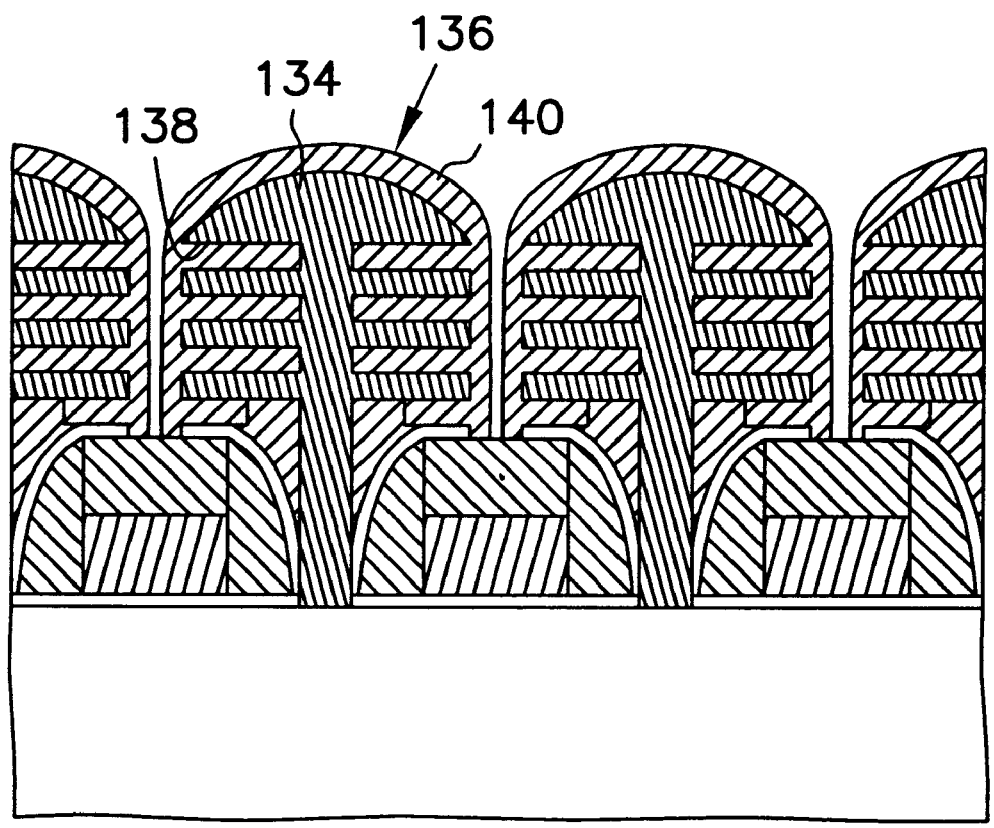

Layers 122 are removed by, for example, an additional wet etch process. As shown in FIG. 4E, each set of trunk 128, fins 130 and dome 132 comprises first plate 134. Dielectric layer 138 is formed outwardly from exposed portions of first plates 134. Further, top electrode 140 is deposited and patterned outwardly from bottom electrodes 134 to form capacitor 136 as shown in FIG. 4F.

Figure 5:
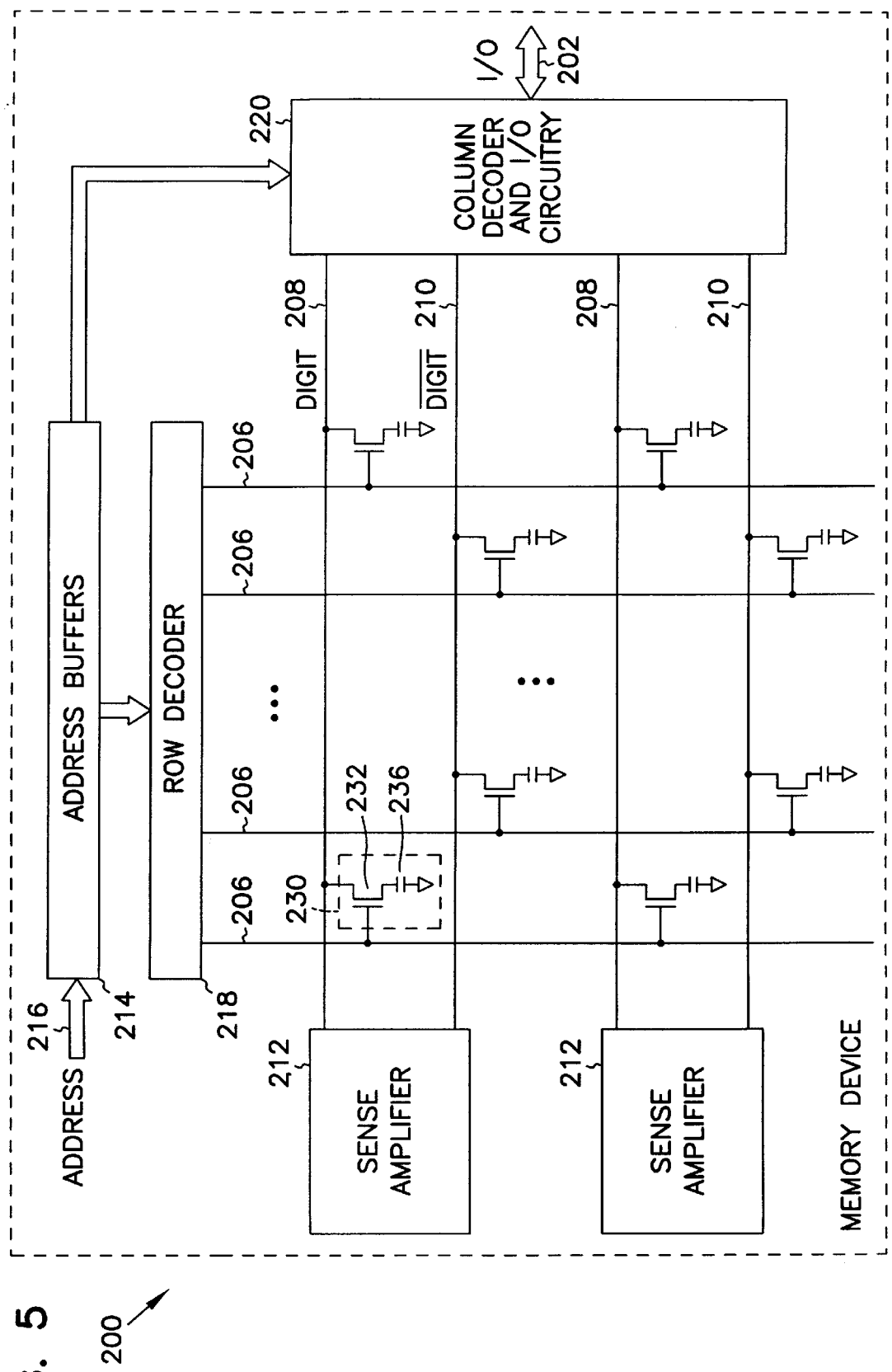
FIG. 5 is a block diagram of an embodiment of the present invention as used in a memory device.

FIG. 5 is a schematic diagram of an integrated memory device, indicated generally at 200. Device 200 uses dual or folded digit lines to transfer data to and from memory cells via input/output (I/O) port 202. Device 200 includes row lines 206, digit lines 208, and digit complement lines 210. Device 200 includes an array of memory cells 230, each memory cell 230 including an access transistor 232 and a capacitor 236. This embodiment of the present invention uses capacitors 236 of the type shown in FIGS. 1 through 4. By using these stacked capacitors, this embodiment decreases the surface area required for capacitors 236, thus increasing the possible number of memory cells 230 per unit area of semiconductor substrate. A memory cell 230 is coupled to each row 206 at the intersection with either a digit line 208 or a digit complement line 210. Sense amplifiers 212 are coupled to a corresponding pair of digit line 208 and digit complement line 210. The operation of device 200 is not tied to the folded digit line configuration shown in FIG. 5. Device 200 may, alternatively, use an open digit line or other appropriate configuration for the array of memory cells that can be accessed through sense amplifiers 212.

Device 200 further includes circuitry that selects a memory cell 230 from device 200 to receive input or provide output to an external device such as a microprocessor (not shown) at I/O port 202. Address buffers 214 receive an address at input port 216 from the external device. Address buffers 214 are coupled to row decoder 218 and column decoder 220. Column decoder 220 includes input-output circuitry that is coupled to the external device at I/O port 202. Row decoder 218 is coupled to rows 206. Column decoder 220 is coupled to digit lines 208 and digit complement lines 210.

In operation, device 200 receives an address of a selected cell at address buffers 214. Address buffers 214 identify a row 206 of a selected cell 230 to row decoder 218. Row decoder 218 provides a voltage on line 206 to activate access transistors 232 of each cell 230 in the selected row 206. The charge on the capacitor 236 is coupled to one of the digit lines 208 or digit complement lines 210. Sense amplifier 212 senses a slight difference between the voltage on digit line 208 and the voltage on digit complement line 210 of the selected cell 230 and drives digit line 208 and digit complement line 210 to the value of the power supply rails.

CONCLUSION

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. For example, other appropriate dielectric materials may be used to form layers 20, 22, 120, and 122. Further, the number of layers 20, 22, 120, and 122 may be altered from the described embodiment to increase or decrease the surface area of first plates 34 and 134. Capacitors 36 and 136 can be used in appropriate integrated circuits other than a DRAM. Capacitors 36 and 136 can be formed with domes and no fins. In this embodiment, alternating layers 20 and 22 or 120 and 122 can be omitted. Further, fins 30 and 130 can be formed around any appropriate percentage of the circumference of trunk 28 and 128, respectively.

What is claimed:

1. A method for forming a capacitor for a memory device, comprising:

forming a first plate that comprises a trunk extending from a semiconductor substrate, and a dome formed outwardly from the trunk that has a surface area that is greater than a planar projection of the dome on a surface of the semiconductor substrate;

forming fins that extend outwardly from the trunk between layers of material;

removing the layers of material from between the fins;

forming a dielectric layer outwardly from the first plate and fins; and forming a top plate outwardly from the dielectric layer.

2. The method of claim 1, wherein forming a first plate comprises forming the first plate using selective deposition of poly-silicon.

3. The method of claim 2, wherein forming the first plate comprises:

forming a second dielectric layer outwardly from the semiconductor substrate;

forming a set of vias in the second dielectric layer; and selectively depositing poly-silicon to fill the vias and to form the dome.

4. The method of claim 1, wherein forming a first plate comprises selectively depositing the fins outwardly from the trunk such that the fins of an adjacent capacitor in an integrated circuit are separated by less than a critical dimension.

5. The method of claim 4, wherein forming the fins comprises:

forming alternating layers of first and second dielectric materials outwardly from the semiconductor substrate;

selectively removing portions of the layers of first dielectric material; and forming the fins in the space between the second layers.

6. The method of claim 5, wherein the first and second dielectric materials are formed from materials that are selectively etchable.

7. A method for forming a plurality of capacitors in a memory device outwardly from a semiconductor substrate, the method comprising:

forming alternating layers of first and second materials outwardly from a semiconductor substrate;

forming a first set of vias through the layers of first and second materials to the semiconductor substrate;

selectively depositing a semiconductor material to fill the vias to form a trunk of a first plate of each capacitor;

removing the alternating layers of first material;

selectively depositing a semiconductor material between the alternating layers of second material thereby producing fins outwardly from the trunks and producing a dome layer of semiconductor material outwardly from an outermost layer of second material with a surface area that is greater than the planar projection of the dome layer on a surface of the semiconductor substrate so as to complete the first plate of each capacitor; and forming a dielectric layer and second plate for each capacitor outwardly from the first plate of the capacitor.

8. The method of claim 7, and further comprising removing the layers of second material after the fins are formed.

9. The method of claim 7, and further comprising forming a second set of vias wherein the vias in the second set of vias are each located a distance from one of the vias in the first set of vias so as to allow removal of the alternating layers of first material.

10. The method of claim 7, wherein forming alternating layers of first and second materials comprises forming alternating layers of first and second materials that are selectably etchable.

11. The method of claim 7, and further comprising forming an etch stop layer outwardly from the semiconductor substrate and a number of digit line spacers prior to forming the alternating layers of first and second materials.

12. The method of claim 7, wherein selectively depositing a semiconductor material comprises selectively depositing poly-silicon.

13. The method of claim 7, wherein forming alternating layers of first and second materials comprises forming alternating layers of first and second materials from dielectric materials.

14. The method of claim 7, wherein the fins of adjacent stacked capacitors are separated by less than the critical dimension for the fabrication process.

15. The method of claim 7, wherein the domes of adjacent first plates are formed at different distances from the semiconductor substrate such that adjacent dome layers form overlapping projections on a surface of the semiconductor substrate.

16. A method for forming a capacitor for a memory device, comprising:

forming a first plate that comprises a trunk extending from a semiconductor substrate, and a dome formed outwardly from the trunk that has a surface area that is greater than its planar projection on a surface of the semiconductor substrate;

forming a dielectric layer outwardly from the first plate;

forming a top plate outwardly from the dielectric layer; and wherein forming the first plate comprises, forming alternating layers of first and second dielectric materials outwardly from the semiconductor substrate;

selectively removing portions of the layers of first dielectric material; and forming a plurality of fins in the space between the second layers and extending from the trunk such that the fins of an adjacent capacitor in an integrated circuit are separated by less than a critical dimension.

17. The method of claim 16, wherein forming a first plate comprises forming the first plate using selective deposition of poly-silicon.

18. The method of claim 16, wherein forming the first plate comprises:

forming a second dielectric layer outwardly from the semiconductor substrate;

forming a set of vias in the second dielectric layer; and selectively depositing poly-silicon to fill the vias and to form the dome.

19. The method of claim 16, wherein the first and second dielectric materials are formed from materials that are selectively etchable.

* * * * *